United States Patent
Englert et al.

(10) Patent No.: US 9,431,798 B2
(45) Date of Patent: Aug. 30, 2016

(54) VARIOUS METHODS AND APPARATUSES FOR A LOW PROFILE INTEGRATED POWER DISTRIBUTION PLATFORM

(71) Applicant: Rosendin Electric, Inc., San Jose, CA (US)

(72) Inventors: Matthew John Englert, Morgan Hill, CA (US); John Manual Loera, San Jose, CA (US); Michael Groh, Scottsdale, AZ (US)

(73) Assignee: Rosendin Electric, Inc., San Jose, CA (US)

( * ) Notice: Subject to any disclaimer, the term of this patent is extended or adjusted under 35 U.S.C. 154(b) by 0 days.

(21) Appl. No.: 14/644,065

(22) Filed: Mar. 10, 2015

(65) Prior Publication Data

US 2016/0079741 A1    Mar. 17, 2016

Related U.S. Application Data

(60) Provisional application No. 62/051,828, filed on Sep. 17, 2014.

(51) Int. Cl.
*H02B 1/21*    (2006.01)
*H02B 1/34*    (2006.01)
(Continued)

(52) U.S. Cl.
CPC ........ *H02B 1/34* (2013.01); *H02B 1/21* (2013.01); *H02B 1/305* (2013.01); *H02B 3/00* (2013.01)

(58) Field of Classification Search
CPC .......... H02B 1/20; H02B 1/015; H02B 1/30; H02B 1/34; H02B 1/305; H02B 1/21; H02B 1/00; H02B 1/26; H05K 7/02; H05K 5/04; H05K 13/00; E04H 1/00; E04H 1/24; E04B 1/80; G05B 11/01; G06F 1/16; G06F 1/18; G06F 1/189; H02G 3/08; H02G 3/285; H02J 9/04

USPC ....... 361/600, 601, 605, 611, 619, 622, 623, 361/624, 625, 627, 730, 813, 724, 728; 174/50, 59, 60, 68.3, 48, 100, 135, 174/72 A, 65 R, 99 R, 17 R, 112; 211/162, 211/182, 133.5, 126.9; 312/223.2, 223.3, 312/265.1, 265.3, 257.1, 265.5; 52/79.1, 52/173.1, 220.2

See application file for complete search history.

(56) References Cited

U.S. PATENT DOCUMENTS 3,066,898 A    12/1962  Haynes
3,643,389 A *  2/1972   Sheppley, Jr. ............ E04B 1/24
                                                52/220.2
(Continued)

FOREIGN PATENT DOCUMENTS

AU    2010253865    5/2015
CA    2763033       12/2010
(Continued)

OTHER PUBLICATIONS

International Search Report and Written Opinion of International Application No. PCT/US2015/050007 mailed Dec. 10, 2015, 8 pages, International Searching Authority, Alexandria, VA.
(Continued)

*Primary Examiner* — Michail V Datskovskiy
(74) *Attorney, Agent, or Firm* — Rutan & Tucker, LLP

(57) ABSTRACT

A method, apparatus, and system are described for a monolithic, pre-wired, pre-engineered, and pre-assembled integrated platform for a critical power supply and electrical distribution system that is scalable and modular. The skeletal framework of the integrated platform acts as an equipment support structure and includes an upper superstructure and a lower superstructure. Two or more cabinet enclosures are mounted onto the lower superstructure where their weight is supported by the skeletal framework. One or more National Electric Code approved (NEC-approved) electrical cable routing support systems are mounted onto the upper superstructure. The skeletal framework also includes one or more vertical columns that are connected between the upper superstructure and the lower superstructure. The skeletal framework and the cabinet enclosures are fabricated in place as a monolithic, pre-wired, pre-engineered, and pre-assembled integrated platform prior to being installed.

20 Claims, 13 Drawing Sheets

(51) Int. Cl.
*H02B 3/00* (2006.01)
*H02B 1/30* (2006.01)
*H05K 7/02* (2006.01)

(56) References Cited

U.S. PATENT DOCUMENTS

| | | | |
|---|---|---|---|
| 3,832,605 A * | 8/1974 | Clark, Jr. | H02B 7/06 |
| | | | 174/481 |
| 3,924,370 A | 12/1975 | Cauceglia et al. | |
| 4,210,772 A | 7/1980 | Magana et al. | |
| 4,214,799 A | 7/1980 | Biche | |
| 4,878,653 A | 11/1989 | Brown | |
| 4,918,258 A | 4/1990 | Ayer | |
| 5,079,890 A | 1/1992 | Kubik et al. | |
| 5,345,779 A * | 9/1994 | Feeney | E04F 15/02411 |
| | | | 361/695 |
| 5,467,609 A | 11/1995 | Feeney | |
| 5,477,649 A | 12/1995 | Bessert | |
| 5,672,920 A | 9/1997 | Donegan et al. | |
| 5,778,606 A | 7/1998 | Davis, Jr. et al. | |
| 6,008,971 A | 12/1999 | Duba et al. | |
| 6,019,322 A | 2/2000 | Shimizu | |
| 6,201,187 B1 | 3/2001 | Burbine | |
| 6,269,000 B1 * | 7/2001 | McCarrol | H02B 1/202 |
| | | | 361/695 |
| 6,480,748 B1 | 11/2002 | Gerszberg et al. | |
| 6,542,500 B1 | 4/2003 | Gerszberg et al. | |
| 6,570,974 B1 | 5/2003 | Gerszberg et al. | |
| 6,657,320 B1 | 12/2003 | Andrews et al. | |
| 6,967,283 B2 | 11/2005 | Rasmussen et al. | |
| 7,278,273 B1 | 10/2007 | Whitted et al. | |
| 7,511,959 B2 | 3/2009 | Belady et al. | |
| 7,646,590 B1 * | 1/2010 | Corhodzic | H05K 7/1492 |
| | | | 361/622 |
| 7,823,337 B2 * | 11/2010 | Pope | E04B 1/3431 |
| | | | 52/64 |
| 7,855,872 B2 * | 12/2010 | Rasmussen | G06F 1/189 |
| | | | 174/480 |
| 7,990,710 B2 | 8/2011 | Hellriegel et al. | |
| 8,681,479 B2 | 3/2014 | Englert et al. | |
| 8,683,753 B2 * | 4/2014 | Bachorz | E04B 1/80 |
| | | | 52/264 |
| 2003/0196402 A1 | 10/2003 | Roen | |
| 2004/0231875 A1 | 11/2004 | Rasmussen et al. | |
| 2005/0068716 A1 | 3/2005 | Pereira | |
| 2005/0078422 A1 | 4/2005 | Pincu et al. | |
| 2006/0087122 A1 | 4/2006 | Sheffield | |
| 2008/0030078 A1 | 2/2008 | Whitted et al. | |
| 2008/0053698 A1 | 3/2008 | Purves et al. | |
| 2008/0060790 A1 | 3/2008 | Yates et al. | |
| 2009/0058098 A1 | 3/2009 | Flynn | |
| 2010/0102633 A1 | 4/2010 | Seaton | |
| 2010/0302744 A1 | 12/2010 | Englert et al. | |
| 2011/0084672 A1 | 4/2011 | Labuschagne et al. | |
| 2012/0326504 A1 | 12/2012 | Ballantine et al. | |
| 2013/0293017 A1 | 11/2013 | Englert et al. | |
| 2014/0098470 A1 | 4/2014 | Robinson et al. | |

FOREIGN PATENT DOCUMENTS

| | | |
|---|---|---|
| MX | 314849 | 11/2013 |
| SG | 176227 | 6/2014 |
| WO | WO 2010/138771 | 12/2010 |

OTHER PUBLICATIONS

Search Results from Wikipedia, http://en.wikipedia.org/wiki/Ampacity, Last accessed Nov. 5, 2012, 3 pages.

Sun Modular DataCenter, Jan. 2008, 4 pages.

Notification of Transmittal of the International Search Report and the Written Opinion for International Patent Application No. PCT/US2010/036485 dated Jul. 27, 2010, 8 pages. International Searching Authority, Alexandria, Virginia, USA.

* cited by examiner

VARIOUS METHODS AND APPARATUSES FOR A LOW PROFILE INTEGRATED POWER DISTRIBUTION PLATFORM

RELATED APPLICATIONS

This application claims the benefit of U.S. Provisional Patent Application No. 62/051,828, filed Sep. 17, 2014, and entitled "VARIOUS METHODS AND APPARATUSES FOR A LOW PROFILE INTEGRATED POWER DISTRIBUTION PLATFORM" and is herein incorporated by reference.

FIELD OF THE DESIGN

Embodiments of the design generally relate to an integrated platform for electric power supply and distribution and more particularly to a pre-assembled, scalable, and modular integrated platform.

BACKGROUND OF THE DESIGN

Construction projects proceed in stages because certain aspects of the project must be completed prior to the next stage being initiated. However, the traditional stages of constructing a building can be altered and some stages can be made in parallel.

SUMMARY OF THE DESIGN

A monolithic, pre-wired, pre-engineered, and pre-assembled integrated platform for a critical power supply and electrical distribution system that is scalable and modular is described. The integrated platform has a skeletal framework that acts as an equipment support structure which includes an upper superstructure and a lower superstructure. Two or more cabinet enclosures are mounted onto the lower superstructure where their weight is supported by the skeletal framework. One or more National Electric Code (NEC) approved electrical cable routing support systems are mounted onto the upper superstructure. The skeletal framework also includes one or more vertical columns that are connected between the upper superstructure and the lower superstructure. The skeletal framework and the cabinet enclosures are fabricated in place as a monolithic, pre-wired, pre-engineered, and pre-assembled integrated platform prior to being installed. The skeletal framework supporting the weight of the cabinets and cable routing support systems is configured to allow the integrated platform including its mounted cabinets to be installed into a building site as a monolithic, pre-wired, and pre-assembled integrated platform.

A method of fabricating a monolithic integrated platform is described. The method includes pre-wiring, pre-engineering and assembling the integrated platform as a power supply and electrical distribution system. The method further includes forming a skeletal framework as support structure of the integrated platform where the skeletal framework which has an upper superstructure and a lower superstructure, mounting two or more cabinet enclosures to the lower superstructure and supporting the weight of the cabinet enclosures by the skeletal framework, and mounting one or more NEC-approved electrical cable routing support systems to the upper superstructure. The method also includes connecting one or more vertical columns between the upper superstructure and the lower superstructure, and fabricating the skeletal framework and the cabinet enclosures in place as a monolithic, pre-wired, pre-assembled integrated platform prior to installing.

BRIEF DESCRIPTION OF THE DRAWINGS

The drawings refer to embodiments of the design.

Figure 1:
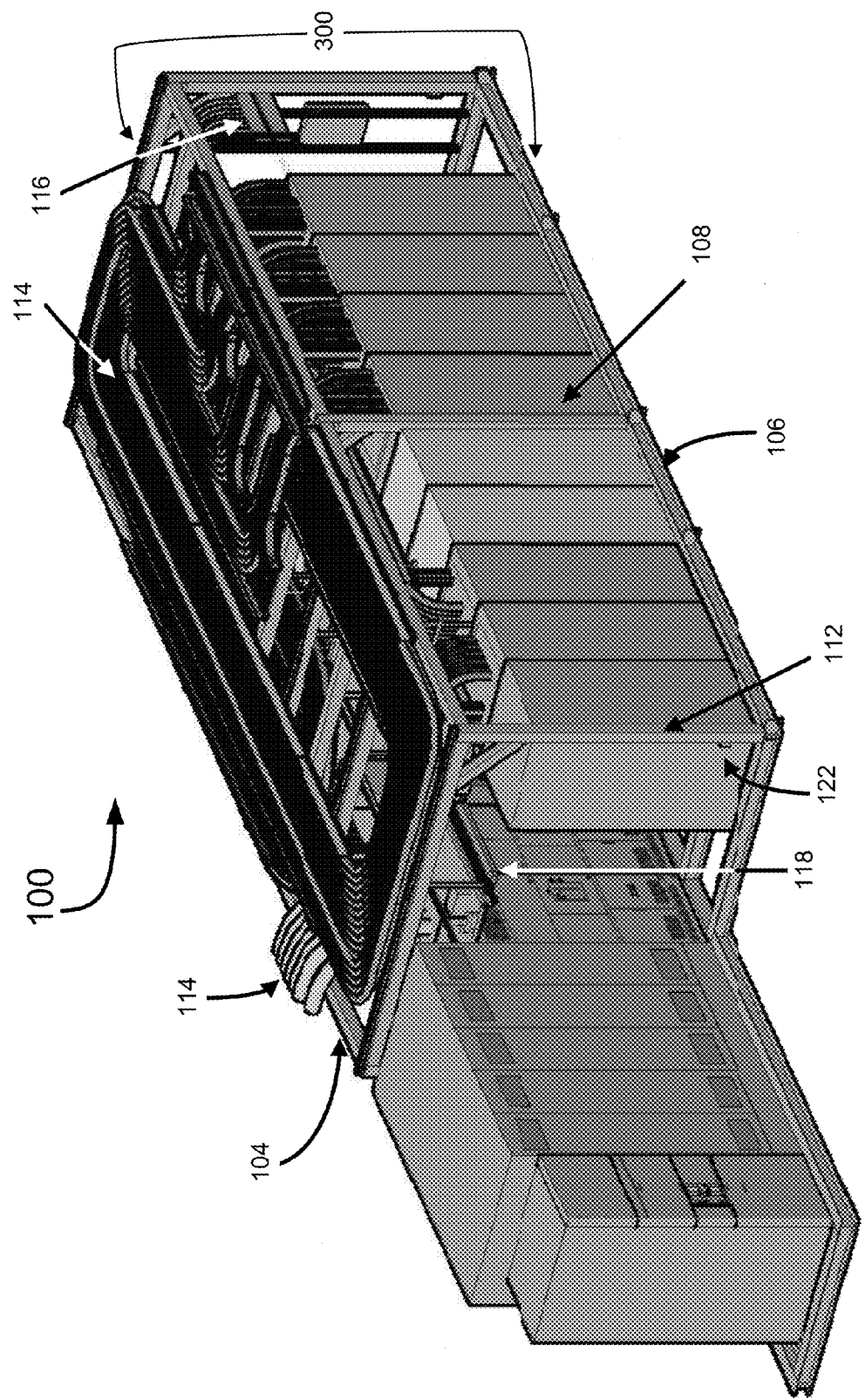
FIG. 1 illustrates a slightly elevated view of an embodiment of a pre-wired and pre-engineered integrated platform for critical power supply and electrical distribution.

While the design is subject to various modifications and alternative forms, specific embodiments thereof have been shown by way of example in the drawings and will herein be described in detail. The design should be understood to not be limited to the particular forms disclosed, but on the contrary, the intention is to cover all modifications, equivalents, and alternatives falling within the spirit and scope of the design.

DETAILED DISCUSSION

In the following description, numerous specific details are set forth, such as examples of specific data signals, named components, connections, number of circuit breakers in a cabinet, etc., in order to provide a thorough understanding of the present design. It will be apparent, however, to one of ordinary skill in the art that the present design may be practiced without these specific details. In other instances, well known components or methods have not been described in detail but rather in a block diagram in order to avoid unnecessarily obscuring the present design. Further specific numeric references, such as first cabinet, may be made. However, the specific numeric reference should not be interpreted as a literal sequential order but rather interpreted as a first cabinet is different than a second cabinet. Thus, the specific details set forth are merely exemplary. The specific details may be varied from and still be contemplated to be within the spirit and scope of the present design. The term coupled is defined as meaning connected either directly to the component or indirectly to the component through another component. Many example embodiments will be discussed below.

In general, disclosed herein are various methods and apparatuses associated with a pre-wired and pre-engineered integrated platform for power supply and distribution that is pre-assembled, scalable, and modular. The monolithic integrated platform may be fabricated by pre-wiring, pre-engineering and assembling the integrated platform as a power supply and electrical distribution system. The fabricated the skeletal framework and mounted the cabinet enclosures, which are wired and assembled in a factory setting may then be installed in the construction site as a monolithic, pre-wired, and pre-assembled integrated platform. The skeletal framework is formed as a support structure for the integrated platform. The skeletal framework includes an upper superstructure and a lower superstructure. Two or more cabinet enclosures are mounted onto the lower superstructure, which includes one or more switchboard cabinet enclosures. The weight of the two or more cabinet enclosures is supported by the skeletal framework to allow the integrated platform including its mounted cabinets to be installed into a building site as a monolithic, pre-wired, and pre-assembled integrated platform. One or more National Electric Code approved electrical cable routing support systems are mounted onto the upper superstructure. One or more vertical columns, typically at least four, are connected between the upper superstructure and the lower superstructure.

FIG. 1 illustrates an elevated view of an embodiment of a pre-wired and pre-engineered integrated platform 100 for critical power supply and electrical distribution which is pre-assembled, scalable, and modular. The integrated platform 100 includes the skeletal framework 300 acting as its support structure.

The skeletal framework 300 includes a lower superstructure 106 and an upper superstructure 104. Two or more cabinet enclosures 108 are mounted onto the lower superstructure and their weight is supported by the skeletal framework 300. The two or more cabinet enclosures 108 include one or more switchboard cabinet enclosures that have at least a set of circuit breakers and one or more bus bars to direct electricity from one or more sources of electrical power supply to other electrical loads including transformers, panelboards, control equipment, and, ultimately, to individual electrical system loads. One or more National Electric Code approved (NEC-approved) electrical cable routing support systems 110 are mounted onto the upper superstructure and supported by the skeletal framework 300. The power and control cables 114 going external to the integrated platform are also shown on the upper superstructure. Additionally, FIG. 1 shows electric ground bars 116, a lighting fixture 118 coupled to a lower section of the upper superstructure 104, and column receptacles 122.

The skeletal framework 300 and the cabinet enclosures 108 are fabricated in place prior to the integrated platform being installed as a monolithic, pre-wired, pre-assembled integrated platform. The equipment will sit on this low profile skid which has a clearance of 5-8 inches (e.g., 7.5 inches) above the ground, and above the equipment mounted on the skid, most to all of the power and control cabling is routed through one or more NEC approved support systems 110 located above the equipment. The cabinet enclosures 108 may include at least a main power supply input breaker housed in a first cabinet enclosure and a power distribution output panel to supply power to electrical loads is in a second cabinet enclosure.

The skeletal framework 300 also includes one or more vertical columns 112 coupled between the upper superstructure 104 and the lower superstructure 106. The skeletal framework 300, the electrical cable routing support systems 110, and the cabinet enclosures 108 are fabricated in place as a low profile skid prior to the integrated platform 100 being installed as a monolithic, pre-wired, pre-engineered, and pre-assembled integrated platform.

Figure 2:
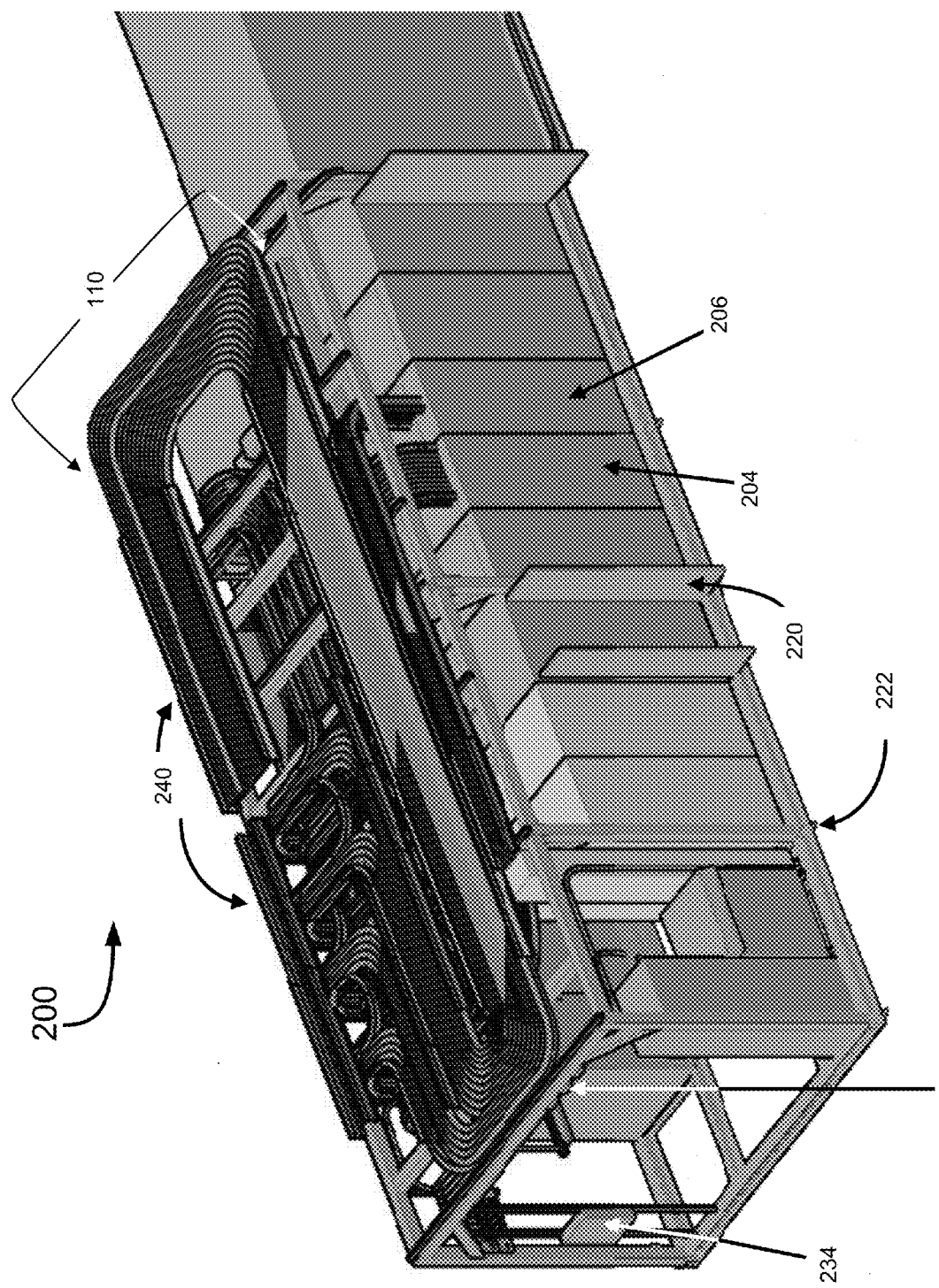
FIG. 2 illustrates an expanded elevated view of an embodiment of the integrated platform including cabinet enclosure rear doors.

FIG. 2 illustrates an expanded elevated view 200 of an embodiment of the integrated platform 100 showing an example first cabinet enclosure (e.g., 204) and an example second cabinet enclosure (e.g., 206) and a cabinet enclosure's rear door 220. The first cabinet enclosure 204 can include a main power supply input breaker and the second cabinet enclosure 206 can include a power distribution output panel to supply power to electrical loads. The cabinet enclosures may include cabinet enclosure rear doors 220 for giving access to the inside of the cabinet enclosures. Additionally, FIG. 2 shows Junction Boxes receptacles (J Box) 232 and a voltage panel distribution 234 coupled to the skeletal framework 300 as well as cable trays 240 coupled to the upper superstructure 104.

Figure 3:
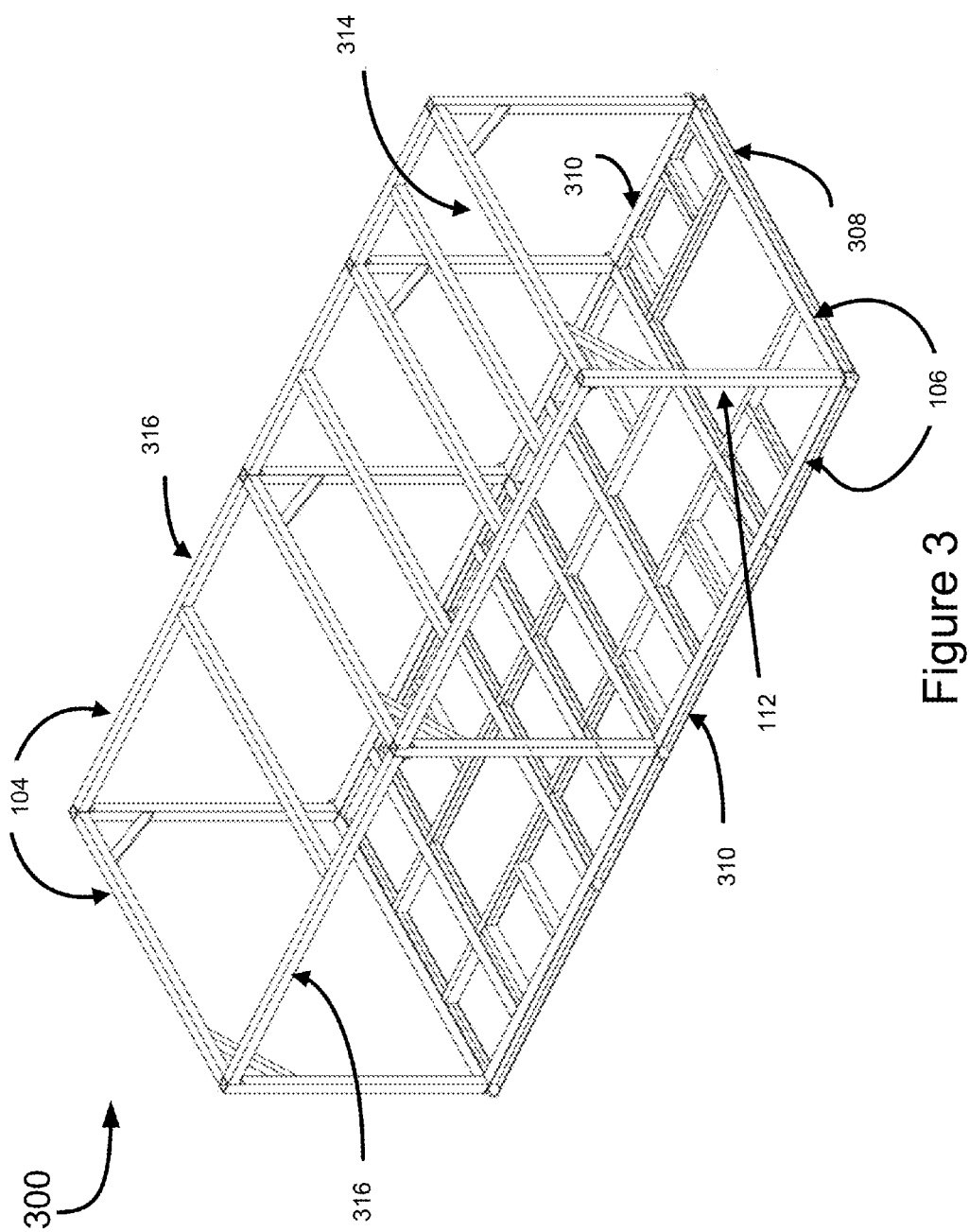
FIG. 3 illustrates a slightly raised side view of an embodiment of the skeletal framework of the integrated platform.

FIG. 3 illustrates a slightly raised side view of an embodiment of the skeletal framework 300 of the integrated platform 100 that acts as a support structure and has a lower superstructure 106 used for mounting the cabinet enclosures 108, 204, and 206 as well as an upper superstructure 104 used for mounting National Electric Code approved (NEC-approved) electrical cable routing support systems 110.

The skeletal framework 300 includes a lower super structure 106, and an upper superstructure 104 and a number of vertical columns 112 coupling the lower and upper superstructures together. The lower super structure 106 includes two or more longitudinal beams 310 and two or more latitudinal beams 308 where the cabinet enclosures 108 can mount to the longitudinal beams 310 and latitudinal beams 308.

Vertical columns 112 are connected between the upper superstructure 104 and the lower superstructure 106. The vertical column 112 can be welded at an upper portion (e.g., top) of the vertical column 112 to the upper superstructure 104, and can be bolted at a lower section (e.g., bottom) of the vertical column 112 to the lower superstructure 106. The bolting of the vertical columns 112 to the lower superstructure 106 allows the installation of the cabinet enclosures 108 without the presence of the vertical columns such that the vertical columns 112 can be bolted to the lower superstructure after the cabinet enclosures 108 are mounted.

The upper superstructure 104 is formed by coupling longitudinal beams 316 and horizontal (latitudinal) beams 314 where two or more longitudinally orientated beams 316 in parallel to each other are coupled with two or more horizontally orientated beams 314 in parallel to each other. The longitudinally orientated and horizontally orientated beams 316 and 314 have holes punched or drilled into them for securely holding cabling structures and cable trays 240. The holes can be punched in predefined specific locations or according to a set pattern of locations.

Figure 4:
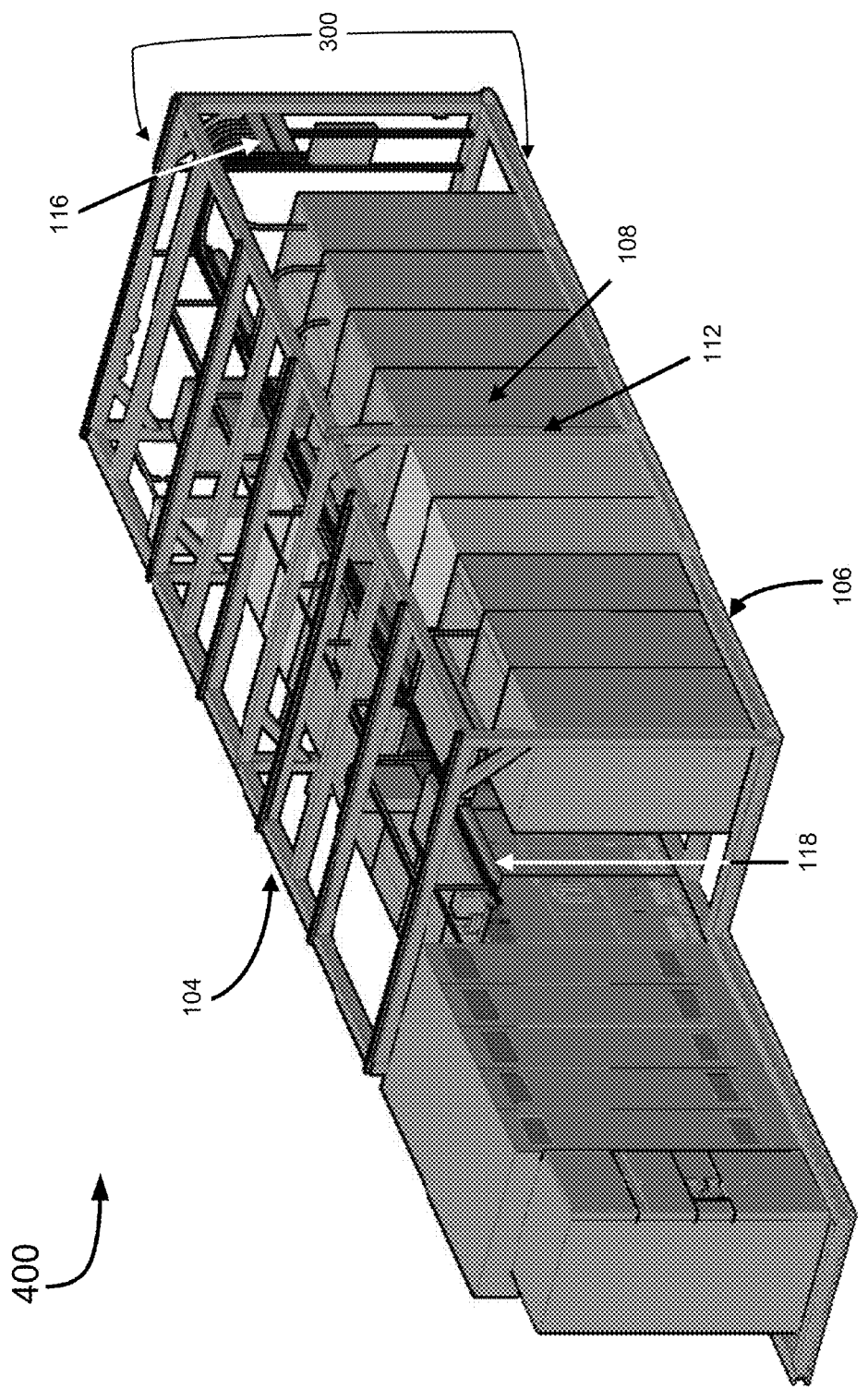
FIG. 4 illustrates a slightly raised side view of an embodiment of the skeletal framework including a number of cabinet enclosures.

FIG. 4 illustrates a slightly raised side view 400 of an embodiment of the skeletal framework 300 including the lower superstructure 106 and the upper superstructure 104 with a number of cabinet enclosures 108 mounted to the lower superstructure 106. FIG. 4 does not show any wiring. This view shows clearly three or more vertical columns are configured to connect the upper superstructure 104 and the lower superstructure 106 on at least two sides of the upper and lower superstructures 104, 106. This view also shows a minimum spacing between the cabinet enclosures based on national electric codes.

Figure 5:
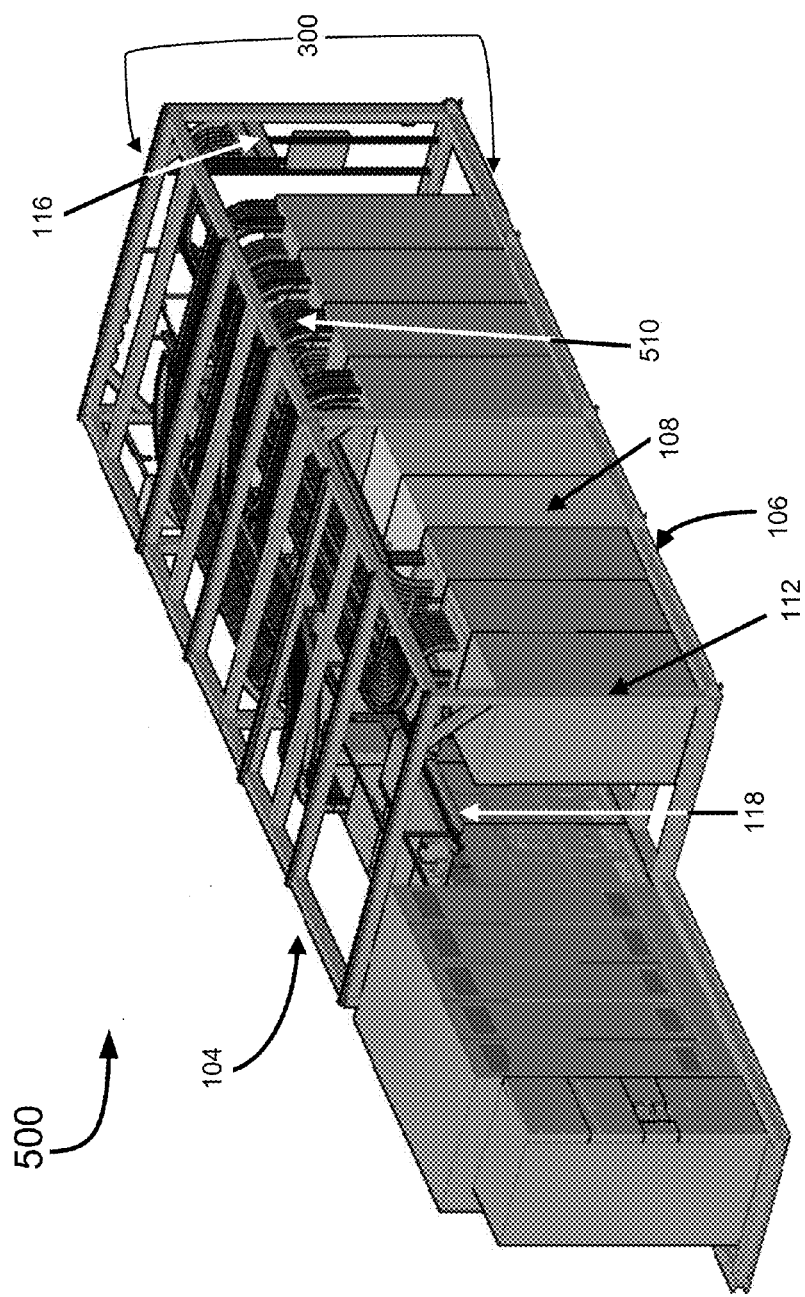
FIG. 5 illustrates a slightly raised side view of an embodiment of the skeletal framework with a number of cabinet enclosures and internal wiring between cabinet enclosures.

FIG. 5 illustrates a slightly raised side view 500 of an embodiment of the skeletal framework 300 with a number of cabinet enclosures 108 mounted to the lower superstructure 106. FIG. 5 also includes internal wiring cables 510 connecting the cabinet enclosures together.

The cabling between the cabinet enclosures 108 of the lower superstructure 106 include 1) internal connections 520 (not shown) in a controlled sequence between neighboring cabinet enclosures 108 and through the sides of the cabinet enclosures which are electrically terminated and connected to create a more orderly wire routing structure and 2) the internal wiring cables 510 between the cabinet enclosures 108 which are routed along the vertical columns 112 to the upper superstructure and within the upper superstructure 104 or just below the upper superstructure to avoid unnecessary cross wires over cabinet enclosures. The upper superstructure 104 has one or more cable trays 240 mounted on top of the skeletal framework 300 to support the weight of the cables and NEC cable trays 240. The cables connecting the cabinet enclosures 108 to the outside of the integrated platform 100, are routed on cable trays 240 and are supported by the upper superstructure 104.

Thus, the control and power cables 114 which externally connect the integrated platform 100 are bundled in one or more cable trays 240 being supported by the upper superstructure 104. Also, the wiring between cabinet enclosures 108 having circuit breakers are routed as either through internal wiring cables 510 below the upper superstructure and/or through internal connections 520 (not shown) wired between neighboring cabinet enclosures 108 and through the sided of the cabinet enclosures 108.

Figure 6:
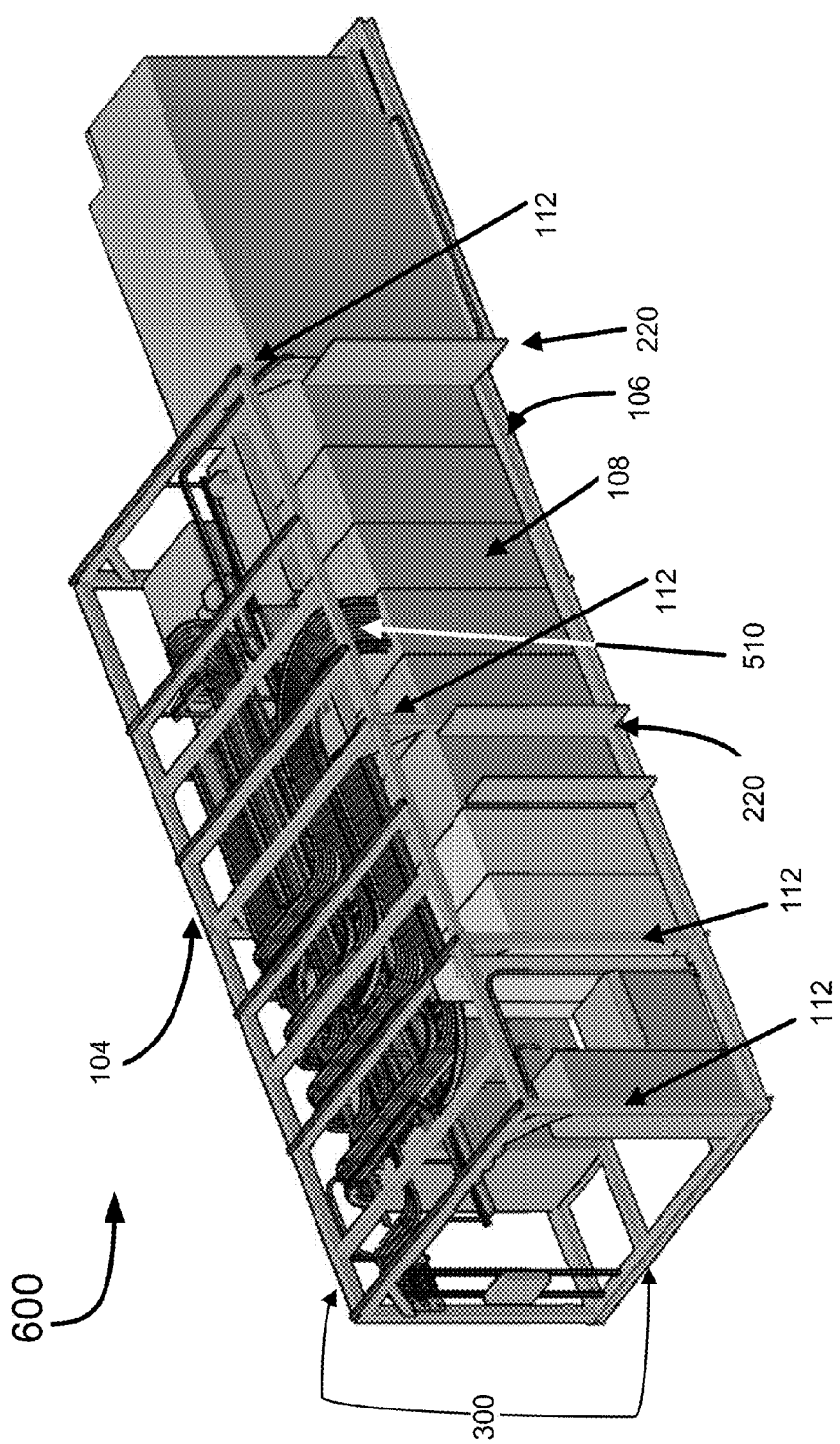
FIG. 6 illustrates a raised side view of an embodiment of the skeletal framework with a number of cabinet enclosures including cabinet enclosure rear doors.

FIG. 6 illustrates a slightly raised side view 600 of an embodiment of the skeletal framework 300 with a number of cabinet enclosures 108 mounted to the lower superstructure 106 which also includes internal wiring cables 510 connecting the cabinet enclosures together and additionally shows the cabinet enclosure rear doors 220. The skeletal framework has locations where the vertical columns 112 can be placed to allow rear door 220 opening and entry into cabinet enclosures neighboring the vertical columns 112. Note, no electrical cable routing support systems mounted onto the upper superstructure are shown in this figure. This view shows how the cabling between the cabinet enclosures mounted on the lower superstructure are electrically terminated and connected. The cabling between the cabinet enclosures is routed 1) through internal connections wired in a controlled sequence between neighboring cabinet enclosures, 2) along the columns to the upper superstructure and within the upper superstructure or 3) just below the upper superstructure along a top of the cabinet enclosures. The controlled sequence of the cable routing substantially avoids crossing cables over each other in the lower superstructure.

Figure 7:
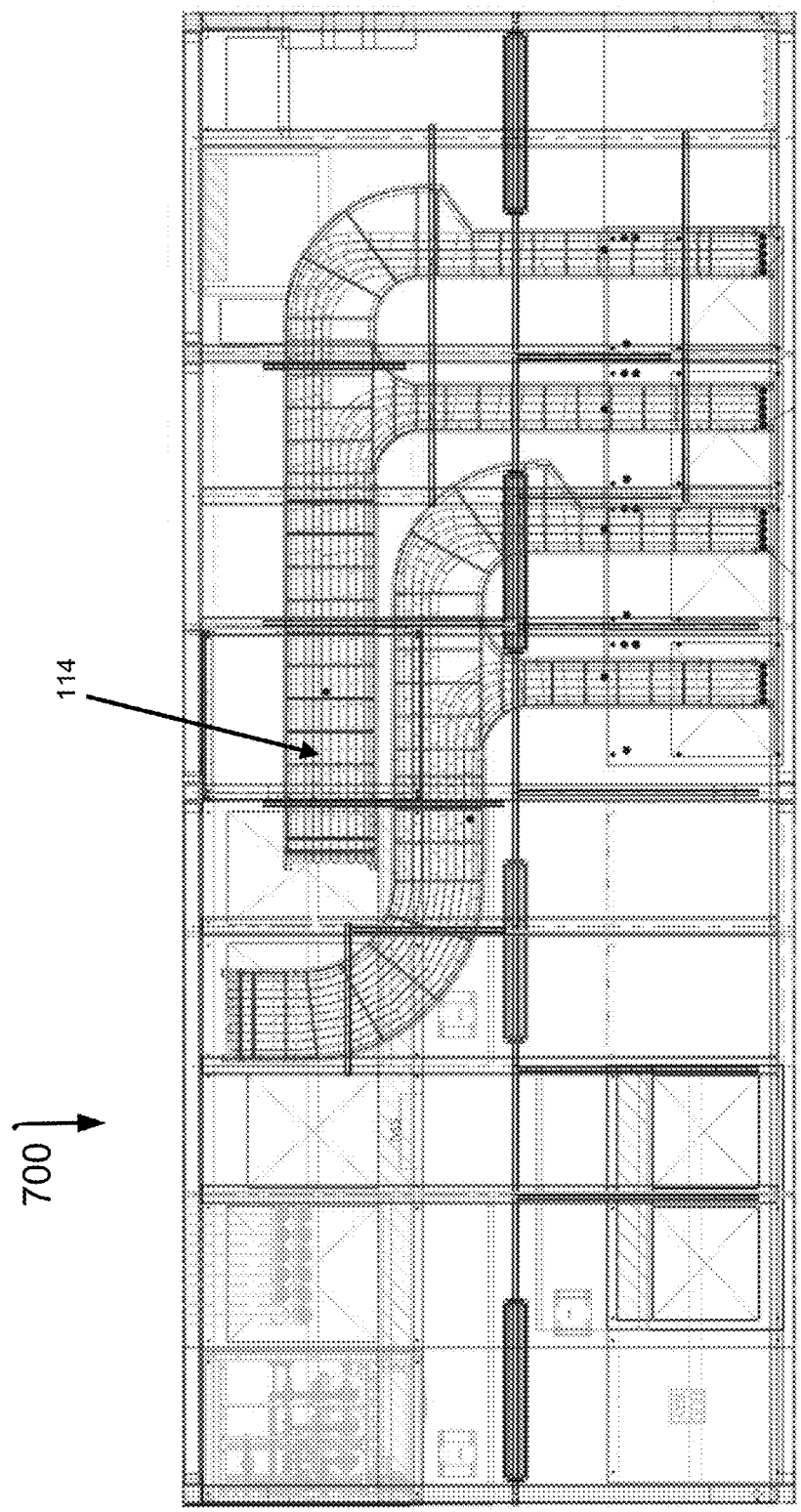
FIG. 7 illustrates a cross sectional top view of the integrated platform which also shows power and control cables.

FIG. 7 illustrates a cross sectional top view 700 of the upper superstructure 104 that also shows a top view of the power and control cables 114 connecting the cabinet enclosures 108 external to the integrated platform 100, which are routed through the one or more National Electric Code (NEC) approved electrical cable routing support systems mounted onto the upper superstructure 104.

Figure 8:
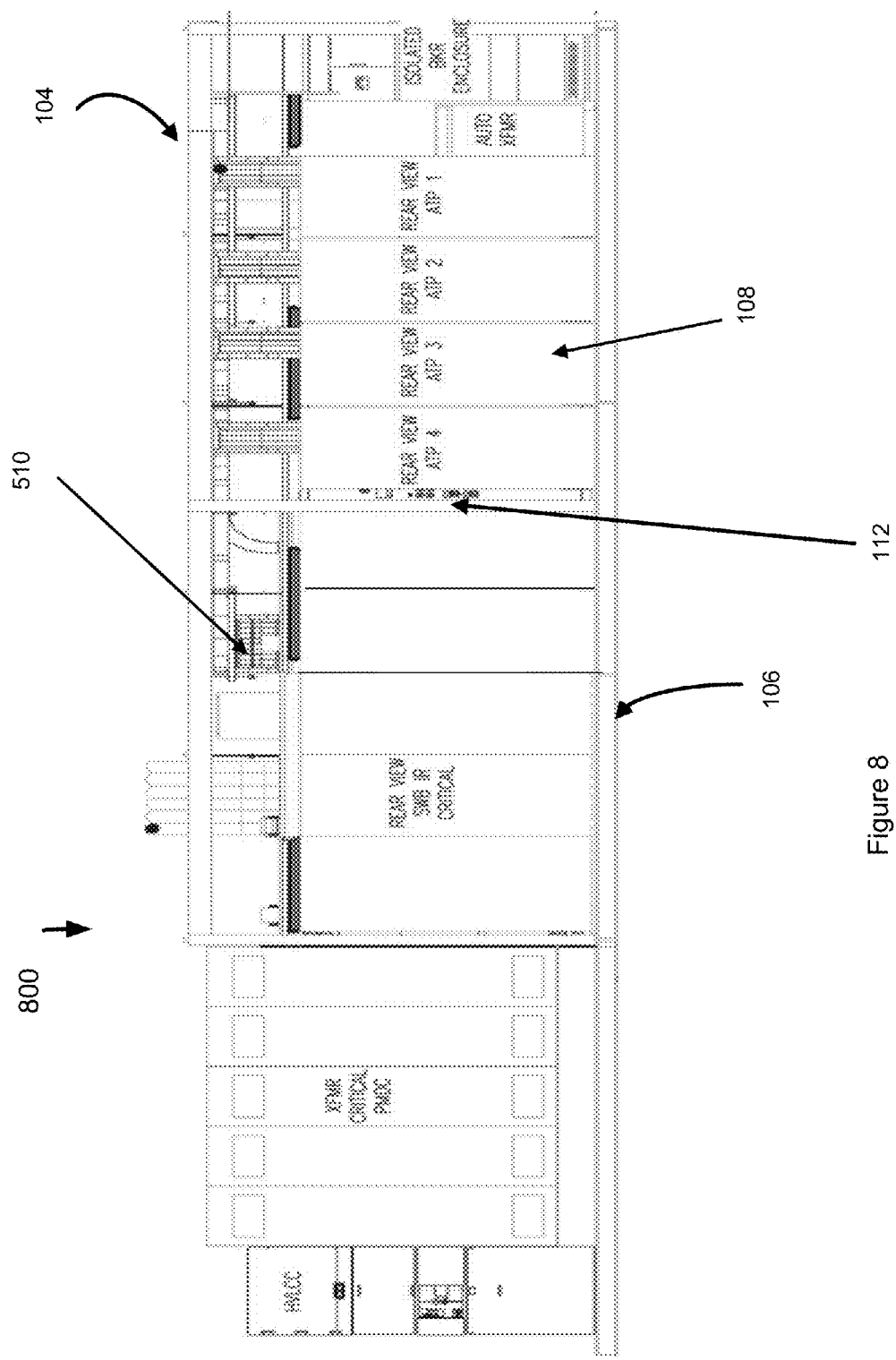
FIG. 8 illustrates a cross sectional side view of the integrated platform which also shows power and control cables and cabinet enclosures.

FIG. 8 illustrates a side view 800 of the integrated platform 100 which also includes internal wiring 510 running between cabinet enclosures and power and control cables 114 connecting the cabinet enclosures external to the integrated platform 100. FIG. 8 also shows cabinet enclosures 108, the skeletal framework 300 including the lower and upper superstructures 106 and 104 as well as a number or vertical columns 112. Various cabinet enclosures mounted onto the lower superstructure including a switchboard cabinet enclosure that has at least a set of circuit breakers and one or more bus bars; a transformer cabinet enclosure, panelboard cabinet enclosures; and other cabinet enclosures.

Figure 9:
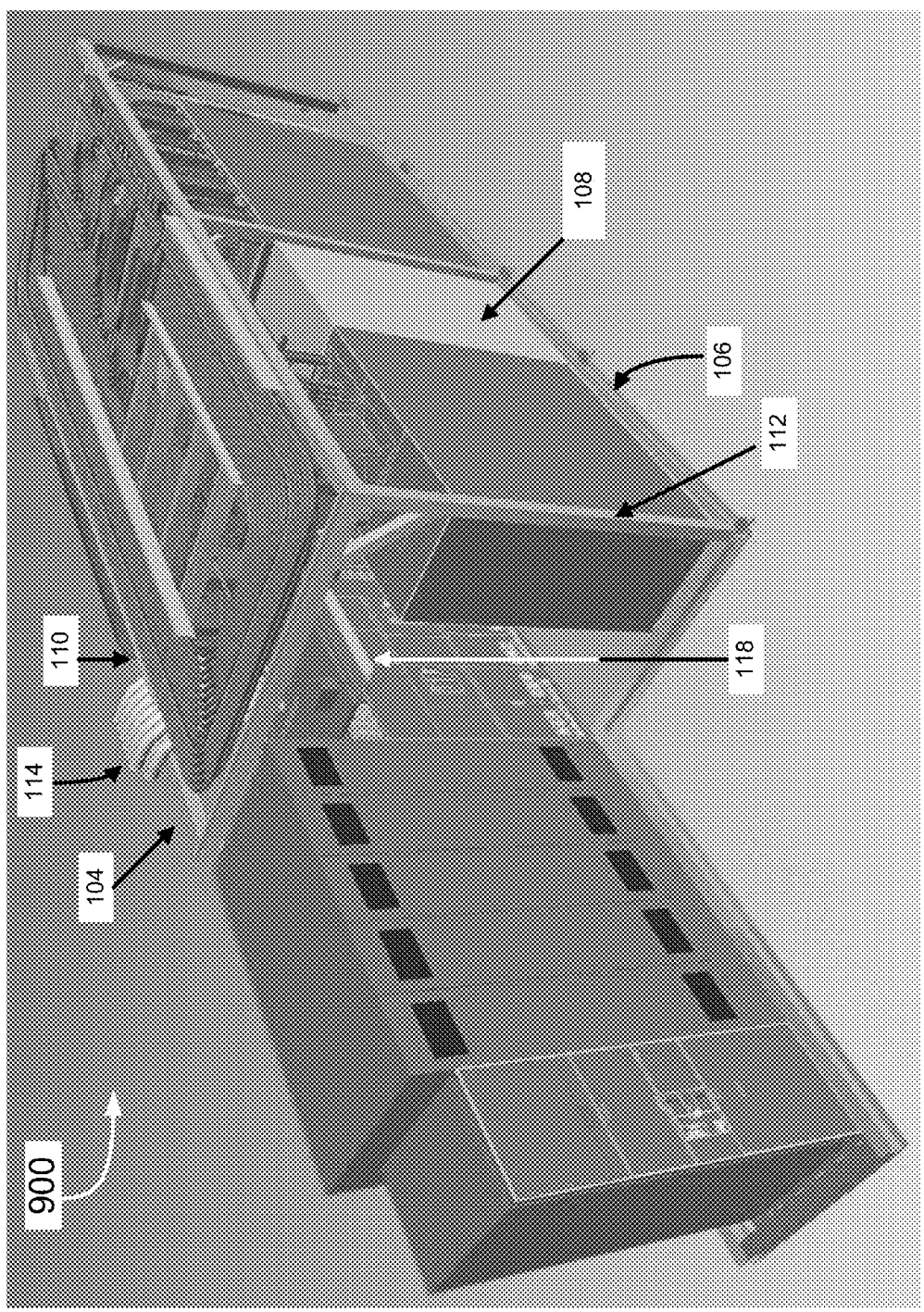
FIG. 9 illustrates a top perspective view of an embodiment of the pre-wired and pre-engineered integrated platform.

FIG. 9 illustrates a top perspective view 900 of an embodiment of the pre-wired and pre-engineered integrated platform 100 for a critical power supply and electrical distribution system. The integrated platform 100 is scalable and modular and includes a lighting fixture 118 coupled to the lower section of the upper superstructure. As shown in the figure the integrated platform is placed on a non-raised floor in a building site, such as a datacenter. An electrical cable routing support system 110 on the upper superstructure 104 on top of the cabinet enclosures is also shown. The control and power cables 114 going external to the integrated platform are bundled in one or more cable trays 110 being supported by the upper superstructure 104. The cable trays 110 are configured to support a weight of the cables 114. Also, the shape of the upper superstructure 104 substantially mirrors and is roughly proportional to the shape of the lower superstructure 106 directly below the upper superstructure 104. In this view, the skeletal framework has the portion where the upper and lower superstructures are mirrored as well an extension section of the lower superstructure 106.

Figure 10:
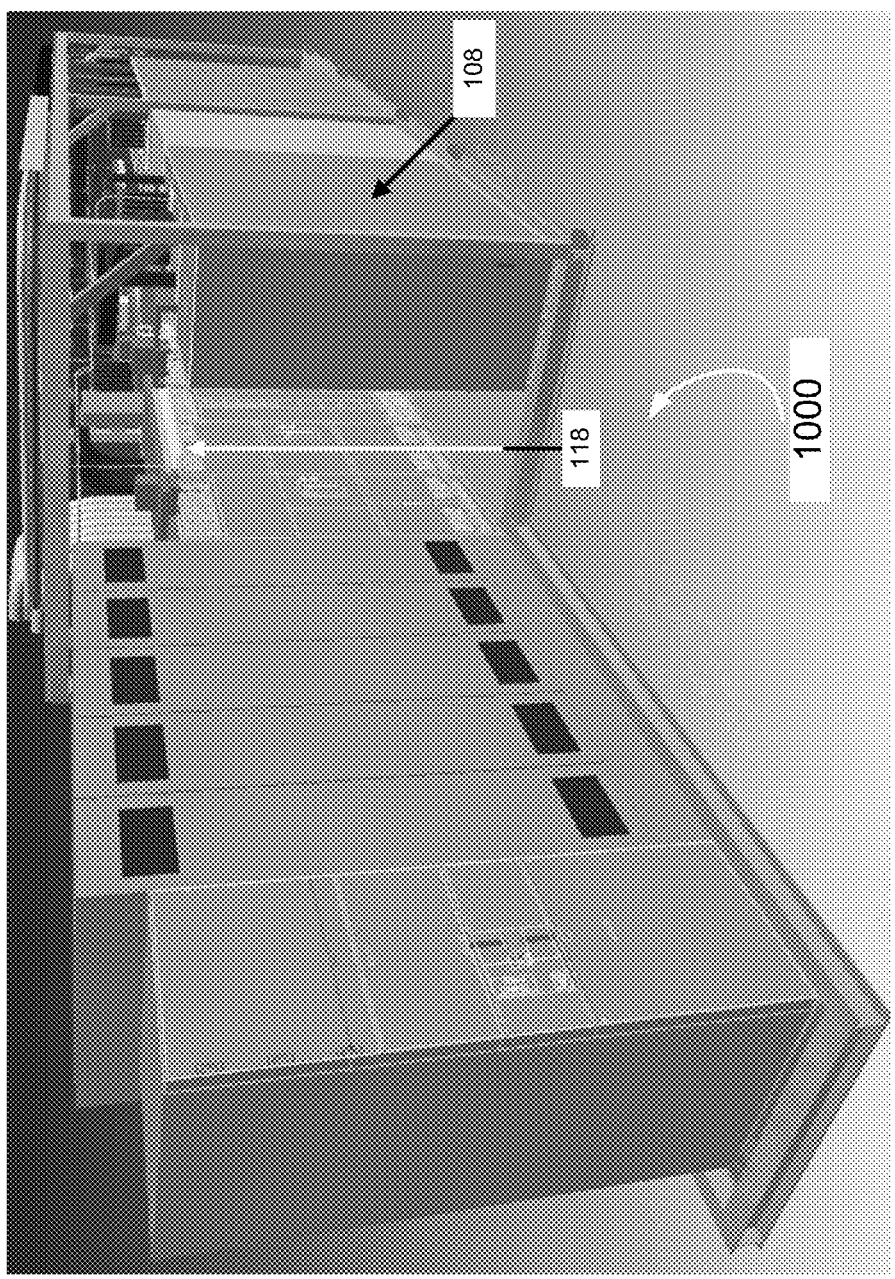
FIG. 10 illustrates a side perspective view of an embodiment of the pre-wired and pre-engineered integrated platform.

FIG. 10 illustrates a side perspective view 1000 of an embodiment of the pre-wired and pre-engineered integrated platform 100 for a critical power supply and electrical distribution system. The integrated platform 100 is scalable and modular and includes a lighting fixture 118 coupled to the lower section of the upper superstructure 104. As shown in the figure the integrated platform is placed on a non-raised floor and the wiring is routed on top of the cabinet enclosures.

Figure 11:
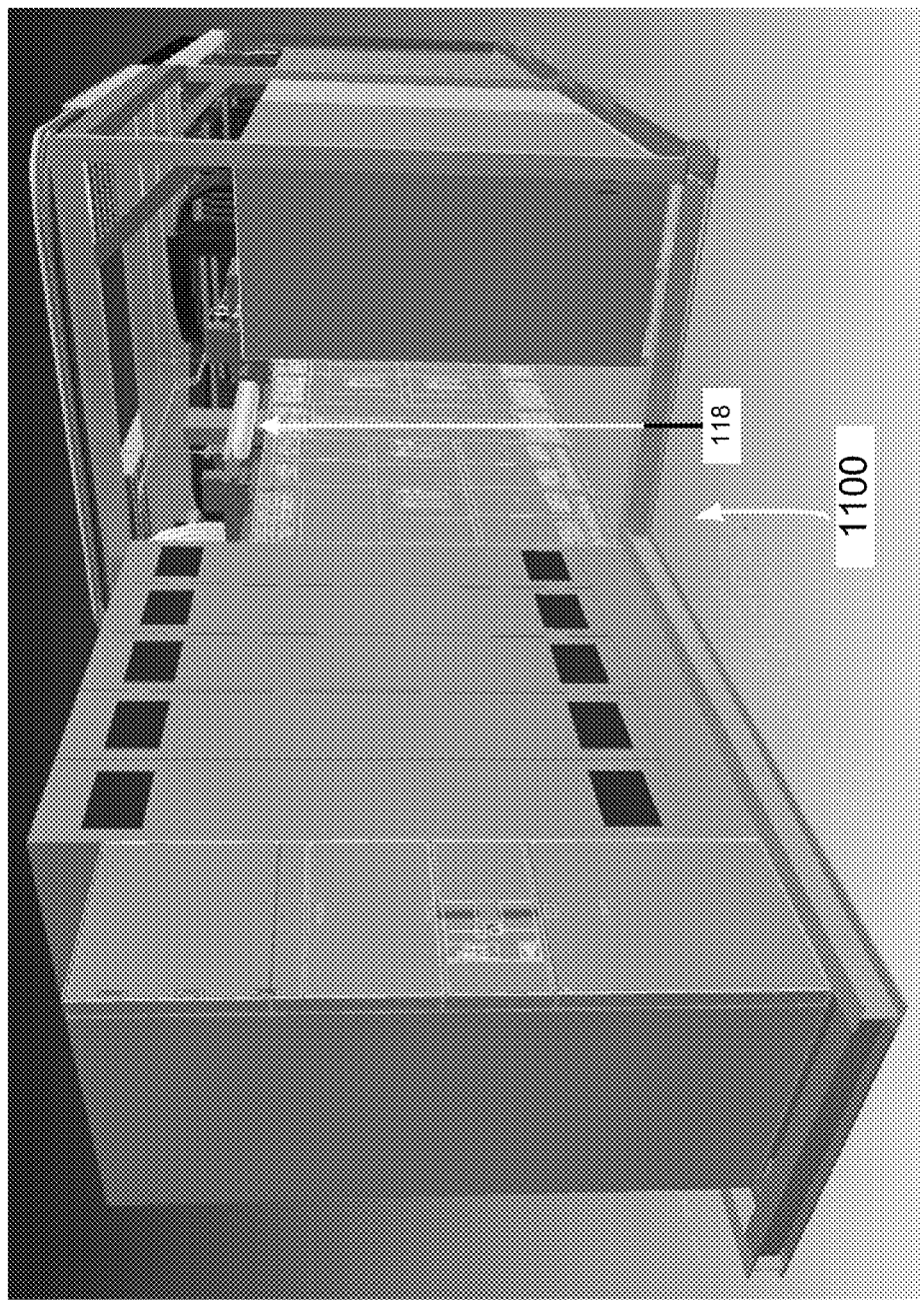
FIG. 11 illustrates a side perspective view of an embodiment of the pre-wired and pre-engineered integrated platform.

FIG. 11 illustrates another side perspective view 1100 of an embodiment of the pre-wired and pre-engineered integrated platform 100 for a critical power supply and electrical distribution system. The integrated platform 100 is scalable and modular and includes a lighting fixture 118 coupled to the lower section of the upper superstructure 104. As shown in the figure the integrated platform is placed on a non-raised floor and all the internal wiring between cabinets is routed on top of the cabinet enclosures 108 just below the upper superstructure 104 or through the sides of the cabinets (which is not visually shown).

Figure 12:
FIG. 12 illustrates a top perspective view of an embodiment of the pre-wired and pre-engineered integrated platform when it is installed in a building site. The wiring of the upper superstructure and skeletal framework are not shown in the figure.

FIG. 12 illustrates a top perspective view 1200 of an embodiment of the pre-wired and pre-engineered integrated platform 100 for a critical power supply and electrical distribution system. The integrated platform 100 is scalable, and modular and shows the arrangements when the integrated platform is installed in a building. The integrated platform 100 is placed on a non-raised floor, however, the wiring that is routed on top of the cabinet enclosures 108 and the skeletal framework 300 are not shown in the figure.

The low-profile skid is an overhead wiring solution for a non-raised floor platform. The low profile skid consists of a lower 106 and upper 104 super section/structure with three or more vertical columns 112 on at least two of each side connecting the lower section 106 to the upper section 104 of the superstructure. The lower and upper super sections can have 4 or more sides (e.g., 6).

The number of vertical columns 112 connecting between the upper superstructure 104 and the lower superstructure 106 is dependent upon at least three factors including i) the weight of the overall platform including all of its two or more electrical cabinets 108 installed on that platform and the weight of the cabling and cable trays on the upper superstructure 104 as well as ii) what is the minimum spacing needed between electrical cabinets to satisfy the national electric code, and iii) where the vertical beams 112 can be placed to allow rear door opening and entry into electrical cabinets neighboring that vertical column 112. One or more of the electrical cabinets 108 mounted on the skid has door access not only from the front of the cabinet but also from the back of the cabinet 108. The faces of the electrical cabinets 108 are lined and spaced per national electric code spacing on the platform. The platform support structure 300 is designed to be open on all sides to allow access to both the front and the back of electrical cabinets 108. Thus, the vertical columns 112 connecting the upper 104 and lower 106 sections/structure are placed such that each electrical cabinet can open its back side to have rear door 220 access to that electrical cabinet without the column interfering with the door opening. The upper superstructure 104 has one or more cable trays 240 mounted on top of that platform and supports the weight of the cables and NEC cable trays 240.

Three or more vertical columns 112 can connect the upper superstructure 104 and the lower superstructure 106 on at least two sides of the upper and lower superstructures, e.g., three columns on each side. The total number of vertical columns 112 connecting between the upper superstructure 104 and the lower superstructure 106 may depend on the factors i) overall weight of the integrated platform 100 including the weight of the two or more cabinet enclosures 108 and the weight of the cables 510 and 114 and cable trays 240 of the upper superstructure 104, ii) minimum spacing between the cabinet enclosures 108 based on the national electric codes, and iii) locations where the vertical columns 112 can be placed such that the vertical columns 112 allow rear door (220) opening and entry into cabinet enclosures 108 neighboring the vertical columns 112.

Thus, the cabinet enclosures 108 can have access doors from the front and/or the back. The faces of the cabinet enclosures 108 are lined and spaced according to national electric codes, and the skeletal frame 300 may be clear on all sides and provide access from both the front and back of the cabinet enclosures 108. The vertical columns 112 connecting the upper and lower superstructures 104 and 106 are placed such that each cabinet enclosure can provide a rear door 220 access clear of the vertical columns 112 near the cabinet enclosure and without the vertical columns 112 interfering with the door opening.

The upper portion 104 of the superstructure has beams orientated longitudinally and horizontally. Two or more beams 316 orientated longitudinally go in parallel to each other and meeting up with two or more beams 314 orientated horizontally in parallel with each other. Where the beams meet up, they are welded together to form a modular superstructure 104. The beams also have holes in either specific locations or in a set pattern of locations for the cabling structures and cable trays 240 to securely attach to the metal beams. The holes in the metal beams are either punched out or drilled out. The electrical cabinets 108 connect to the mounting holes drilled or punched through the beams forming lower structure 106 of the modular power platform. The punched or drilled holes in the beams can be matched to a specification of where the holes need to be pre-punched. The one or more cable trays 240 mounted on the upper superstructure 104 form a national electric code approved raceway 110.

Note, all or at least a majority of the cabling between the electrical cabinets 108 and internal to the cabinets mounted on the lower section 106, are electrically terminated and connected. The cabling 510 is routed along the columns 112 or within the superstructure 104 or just below the superstructure 104 but relatively no wiring is wired on the lower platform 106. The low-profile skid is configured to have internal connections 520 wired in a controlled sequence to allow for the easiest installation of wiring between cabinets; and thus, avoid having to cross wires over each other unnecessarily. The controlled sequence of internally connecting the cabinets 108 mounted on the platform creates a more orderly wiring routing structure. The cables 114 going external to the platform, including control and power cabling, going into the building are carried on the cable trays 240 resting and supported by the upper structure 104.

All or substantially almost all external control and power wiring 114 comes on one or more cable trays 240 being supported by an overhead structure 104. Internal wiring between the breaker cabinets 108 comes through 1) internal connections 520 between sides of neighboring cabinets 108, or 2) through internal wiring 510 in the conduits between cabinets and just below the upper section 104 of the platform.

Each power and control cable 114 going external to the integrated platform is routed through one or more NEC-approved electrical cable routing support systems 110 where the NEC-approved electrical cable routing support systems 110 are located above the cabinet enclosures 108 and supported by cable trays 240.

The superstructure 300 has at least a pair of electrical ground bars 116 to ground the electrical platform 100 as well as connects to the building's system ground. The electrical platform has both a master ground bar and a secondary ground bar as well as a number of J box receptacles 232.

Thus, the integrated platform 100 may include at least a pair of electrical ground bars 116 coupled to the skeletal framework 300. The ground bars 116 can be used to ground the integrated platform 100 to a ground external to the integrated platform 100.

The superstructure has one or more voltage distribution panels 234 mounted onto the skeletal framework 300 of the platform; and in addition, a mounted panel 234 that allows low-voltage such as 125V electrical connections to electrical cabinets 108.

The superstructure 300 also has one or more AC power receptacles 122 mounted onto one more columns 112 of the superstructure 300 to allow AC plug-in to those columns. The wiring through conduit or other NEC approved cabling method is also routed from a distribution panel 234 to the one or more AC power receptacles 122.

The integrated platform 100 may also include a voltage panels 234 mounted onto the skeletal framework 300 where the voltage panels 234 are configured to supply a nominal low-voltage electrical connection of 125 V, AC power receptacles 122 mounted onto vertical columns 112 to supply AC plug-ins. A wiring through internal wiring cables 510 (a conduit between cabinet enclosures) or other NEC-approved electrical cable routing support systems 110 can connect a power distribution output panel 234 to the AC power column receptacles 122.

The lower portion 106 of the structure/platform contains one or more switchboard cabinets, one or more power distribution cabinets, as well one or more control circuitry cabinets, and potentially, one or more transformers and its control cabinet and one or more uninterruptible power supplies. The control cabinets also include a programmable logic controller to control the sequence of how breakers will open and close during fault conditions. Each of these cabinets 108 mounts to the lower section 106 of the superstructure.

Thus, the lower superstructure 106 may include cabinet enclosures 108 mounted to the skeletal framework 300 and used for housing switchboards, power distribution output panels, control circuits, transformers, uninterruptible power supplies, and programmable logic controllers that can control how the sequence of breakers open and close during fault conditions. The cabinet enclosures 108 are closely mounted side-by-side onto the skeletal framework 300 according to a NEC-approved code. The cable interconnections between cabinet enclosures 108 that need over current protection are routed through the upper superstructure 104 using internal wiring cables 510 rather than connecting through internal connections 520 through the sides of the neighboring cabinet enclosures 108.

As discussed, the frame 300 of the superstructure consists of the lower section 106, the upper section 104, and a series of vertical beams/columns 112 connecting between the lower and upper section. The lower section 106 consists of a series of horizontal beams 308 connecting into a pair of longitude beams 310. The width and height and number of the beams in the lower platform 106 is determined by the amount of weight that the entire structure 300 is going to be carrying but can be 7 inches in height or lower. The number of beams in parallel is set such that to contain at least all of the cabinets 108 mounted on the frame of the skid. The upper structure 104 consists of a series of horizontal beams 314 connected into two or more longitudinal beams 316. The upper section 104 is connected to the lower section 106 via three or more vertical columns 112 on at least two sides of the structure. As discussed, the beams in the lower section may be up to 7 inches tall and 7 inches wide; whereas, the beams in the upper section may be up to nearly 5 inches wide. The 7 inches high corresponds to the maximum height of one step high. The lower section 106 additionally can have one or more beams connecting longitudinally in between the two outside beams to create more of a hatched pattern for both support and locating connection points for the cabinets 108 to mount onto the lower portion 106 of the electrical skid platform. In the hatched pattern, beams may deviate from the regularly spaced pattern and spacing and orientation depend on the number of cabinets 108, shape of the cabinets, and total weight being placed on top of that part of the lower section of the skid. The platform from its lower section 106 to the top of its upper section 104 including the cable trays 240 is less than 12 feet in height. The shape of the upper section may mirror the shape of the lower section directly below the upper section in order to allow easy connection points for the columns 112 to attach to.

Thus, the shape of the upper superstructure 104 and the lower superstructure 106 can mirror and be proportional to each other. Further, the shape of the bottom portion of the upper superstructure 104 can be a mirror reflection of the shape of the upper portion of the lower superstructure 106 providing similar locations on both structures to easily connect the vertical columns 112 between the upper superstructure 104 and the lower superstructure 106.

The low-profile skid has electrical connections configured and engineered to allow for the electrical power grid/utility power cabling to connect to as well as for the back-up power generators to connect to. The pre-wiring of the electrical platform and these connections to mate up with both the electrical power grid and one or more back-up power generators are built into cabinets 108 mounted onto the platform/superstructure 106 itself. The skid also has the cabling for lighting as well as the lighting sockets and receptacles 122 mounted onto the superstructure of the upper structure 104 of the skid. The skid has a strut assembly for supporting the lighting 118 on the skid.

The platform is in-filled with flooring after the installation of the electrical cabinets 108 mounting onto the beams in the lower section. The in-fill may be with common plate steel flooring or its equivalent. Thus, the cabinets 108 sit on the horizontal 308 and longitudinal 310 beams and the rest of the surface of the lower section is in-filled with flooring. The weight of the electrical power skid with its cabinets 108 is enough so that it is heavy enough to not be tied to the foundation of the building and still be rated to be secure in at earthquake. Thus, the platform may have at least a 1.5 importance factor rating. Also, all of the welding will hold together during an earthquake.

Thus, the lower superstructure 106 can have holes punched or drilled through predetermined specific locations and/or a predefined pattern of locations in the longitudinal beams 310 and latitudinal (horizontal) beams 308 forming the lower superstructure 106. The cabinet enclosures 108 can mount to the holes of the lower superstructure 106 where the cabinet enclosures sit on the horizontal and longitudinal beams and the rest of the surface of the lower superstructure 106 may be in-filled with flooring after mounting of the cabinet enclosures 108. Further, the in-filling can include common plate steel flooring or its equivalent.

Further, the weight of the integrated platform 100 including the cabinet enclosures 108 is heavy enough to be rated secure in earthquake without being tied to the foundation of the building such that it may have at least a 1.5 importance factor rating. Also, the connection points of the skeletal framework 300 of the integrated platform 100 including the upper superstructure 104, the lower superstructure 106, and the vertical columns 112 may be welded together or connected via bolt and torqued to comply with Zone 4 seismic requirements.

As discussed, the upper section 104 and lower section 106 beams are welded together with the vertical columns beams 112 in order to form a monolithic structure 300 that can be lifted and carried into place as a singular modular unit.

The lower section and potentially the upper section have a series of eye bolts 222 welded into the platform beams to allow the electrical platform to be lifted and set into place by a crane. The eye bolts 222 are not mated to a nut and then torqued because that would not form a structurally sound enough mechanical connection for the lifting and placing the electrical platform as one modular unit.

As a result, the lower superstructure 106 or both the lower and upper superstructures 106 and 104 may have a series of eye bolts 222 welded into skeletal framework beams 308, 310, 314, and 316. The integrated platform 100 may be lifted and set into a place by a crane using the eye bolts 222. To make a structurally sound mechanical connection for lifting, the eye bolts 222 are welded rather than mated to a nut or torqued.

The electrical platform 100 comes pre-manufactured and fabricated with the electrical cabinets 108 and all their internal wiring 510 and internal connections 520 connecting the electrical cabinets 108 on that skid to each other already connected.

As discussed, the cabinets 108 are mounted securely in place on the beams of the lower section 106. All of the electrical connections are made and control and power cabling 114 going outside of the switchboards to the building are routed in the cable trays 240 being supported by the upper section 104. Accordingly, the overhead power distribution and control wire distribution allows for a turnkey installation of the modular power center platform 100 to be installed as a modular unit allowing for a rapid deployment of this electrical distribution platform to occur on a construction site. The skid with its installed cabinets 108 does not need any assembly of the cabinets at the construction site, put the cabinets in place, do the internal connections 520 and internal wiring cables 510 between the cabinets themselves, or then test those connections. This can happen while construction is occurring at that site. All of those activities as well as additional installation of breaker panels, AC voltage outlets 122, lighting 118, low-voltage distribution panels 234 and so forth are installed on the platform 100 and tested prior to shipping the modular unit to the site where construction is occurring.

The low-profile skid is designed, assembled, internally wired, and tested out, all prior to being shipped to the construction site and comes in as a modular integrated solution for electrical power distribution at that site. The power connections 114 connecting externally to the electrical power skid can be prewired into the cabinets from the cable trays 240 as well as all of the power connections 510 and 520 internal to the skid are prewired. The modular power center platform is wrapped in shrink-wrap for shipping to the construction site to prevent any dust or other damage to the equipment or wiring on the platform.

An embodiment of pre-wired and pre-engineered integrated platform 100 for power supply and distribution has two or more cabinet enclosures 108 including switchgear cabinets and power control cabinets mounted onto that framework 300.

Another embodiment of pre-wired and pre-engineered integrated platform for power supply and distribution has two or more cabinet enclosures 108 including two or more UPSs mounted onto the skeletal framework 300. The skeletal framework 300 and the cabinet enclosures 108 are fabricated in place prior to the integrated platform being installed on site and all of the components are installed as a monolithic, pre-wired, pre-assembled integrated platform.

Another embodiment provides a static switch included in a main UPS in a third cabinet enclosure. A backup UPS housed in a fourth cabinet enclosure is mounted back to back with the main UPS in the third cabinet enclosure. The main and backup UPSs are electrically connected in parallel. The static switch cabinet contains electrical equipment to ensure instantaneous switchover from one UPS to the other in the event of a power failure. The third cabinet contains a maintenance bypass switch for power when both the main UPS and the backup UPS are electrically isolated from the electrical loads connected to the power distribution output cabinet mounted on the framework 300 of the skid.

As discussed, the pre-wired and pre-engineered integrated platform 100 has a skeletal framework 300 that acts as an equipment support structure. The skeletal framework 300 can support the weight of two or more cabinet enclosures and two or more UPSs mounted onto the skeletal framework 300. The two or more cabinet enclosures at least include 1) a main power supply input breaker housed in a first cabinet enclosure mounted to the skeletal framework 300 and 2) a power distribution output panel housed in a second cabinet enclosure mounted to the skeletal framework 300 to supply to power electrical loads. Electrical connections between the two or more cabinet enclosures may be internally connected via bus bars as switchgear cabinets.

As stated, skeletal framework 300 of the integrated platform 100 has top beams 314 and 316 and bottom beams 308 and 310 that can run substantially parallel to each other with vertical beams 112 connecting the top and bottom beams to form the skeletal framework 300 of the integrated platform 100. Some irregular patterned horizontal surfaces and structures may be formed into the beams on the lower framework 106 to better facilitate mounting the cabinets and UPSs.

Another embodiment provides that each cabinet enclosure 108 including the UPSs, are fastened and torqued to a top side of the top horizontal surface of the lower section of the skeletal framework 300.

Another embodiment provides that the beams of the skeletal framework 300 are separated by a gap close enough to provide mounting areas for the cabinet enclosures 108 to mount to as well as close enough to give structural support to the entire integrated platform structure when installed in place as the monolithic, pre-wired, pre-assembled integrated platform 100 by a crane at a construction site.

The series of cabinet enclosures 108 are close coupled side-by-side when mounted onto the skeletal framework 300 of the integrated platform 100.

The series of electrical cabinets 108 may each contain circuit breakers within a given electrical amperage rating range. The electrical circuit breakers can be separated by 1) amperage ratings, such as 1600 amp cabinets, 3000 amp utility, or generator input cabinets, 450 amp PDUs, or 2) separated by functionality, into each of the electrical cabinets. The grouping by amperage or functionality provides significant advantages in costs and area needed.

The weight of the integrated platform 100 including the mounted cabinet enclosures 108 and the skeletal framework 300 is heavy enough by itself to be structurally sound and is not required to be anchored to either a construction foundation or to a building's foundation in non-seismic zones. Thus, the integrated platform 100 may be anchored or free-standing, depending on where it is located seismically. The integrated platform can provide up to 1200 KW in critical power from the main and backup UPSs in a floor space footprint of less than 470 square feet, which results advantageously in more open space to lease in a datacenter. The size of the modules and weight of the integrated platform 100 is constrained by the need to ship skids over highways from the assembly facility to the job site. Typically, the shipping packages are not to exceed 50 feet by 12 feet and 100,000 pounds.

As discussed, the height of the integrated platform 100 from a bottom of the lower superstructure 106 to a top of the upper superstructure 104 including cable trays 240 can be less than 12 feet. Additionally, the integrated platform 100 can have a length and a width which occupy a floor space footprint of less than 480 square feet and may provide a shipping package size to have a footprint size not to exceed 50 feet by 12 feet and a weight not to exceed 100,000 pounds. The integrated platform 100 can provide up to 1200 KW in critical power from a main and a backup switchgear cabinets.

The integrated platform 100 could be installed either internally or externally to the datacenter's brick-and-mortar shell structure.

Using a modular approach, the use of an integrated platform 100 allows for a smaller square footage and less construction time, resulting in savings in time and cost. Even though the size is dramatically reduced, more power is generated per square foot than with previous modular power centers because more capacity is configured into the aggregated uninterruptable power supplies.

In an embodiment, important improvements include providing a complete datacenter, critical-power distribution package on an integrated platform. The complete datacenter, critical-power distribution package provides more power (up to 1200 KW) in a smaller floor space footprint of approximately 464 square feet. The smaller the square foot floor space occupied by an electrical power distribution platform the better. This allows the datacenter building facility to have more available square footage to use for other purposes, such as leasing square footage space for computing equipment to clients. Close coupling the inputs and outputs allows a continuous switchgear lineup between input and output switchgear sections. The one or more uninterruptible power supplies can electrically and physically mount in close proximity with the series of electrical switchgear cabinet enclosures to occupy less space overall. All of these components are mounted on a steel support frame that is pre-assembled in an offsite manufacturing center.

In an embodiment, power cables from a utility power grid comes in through a main step down transformer via one or more circuit breakers in a main switchboard cabinet. The AC power is distributed by the one or more circuit breaker distribution cabinets to building loads such as mechanical cooling power loads for a datacenter and electrical power consuming loads like servers and databases.

Another cabinet on the skid can have one or more electrical connections to the power cables of a backup AC power generator, one or more electrical connections to the signal controls to the backup AC power generator to start up the AC generator in an emergency and monitor its status, and one or more electrical connections to the power cables of a main AC power generator including a step down transformer connected to the power lines of the electrical power grid. The uninterruptible power supply contains the control circuitry and software that controls a system static switch and a bypass control circuitry. The bypass control circuitry in the uninterruptible power supply cabinet controls first and second electrically parallel breakers to connect the main uninterruptible power supply via the first breaker to the power distribution center and to connect the backup uninterruptible power supply via the second breaker to the power distribution center via the maintenance bypass breaker. The bypass control circuitry allows selection of the external AC power source directly to the power distribution center, thus bypassing the main and backup uninterruptible power supplies while still supplying AC power to the power distribution center by electrically closing the maintenance bypass breaker and opening the first and second electrically parallel breakers.

A main switchboard cabinet on the integrated platform 100 can have one or more electrical connections, including a first electrical connection and an associated circuit breaker to receive power cables coming from a main generator, acting as the backup AC power source, and a second electrical connection and associated circuit breaker coming from a step down transformer connected to power lines of the utility electrical power grid.

The power from the utility power grid comes in through a main step down transformer. Power from a utility power grid comes in through a main step down transformer via one or more circuit breakers in a main switchboard cabinet to power mechanical cooling power loads for a datacenter and via additional circuit breakers to supply power through the main and backup UPSs. The main and backup UPSs' supply critical power to computer equipment power distribution loads for the datacenter via further circuit breakers in the power distribution output panel.

A main switchboard cabinet of the two or more cabinet enclosures contains a programmable logic controller to control fault tolerance operations on the integrated platform. The ability of the programmable logic controllers to stay in synchronous operation allows for a seamless transfer of control between either unit.

Figure 13:
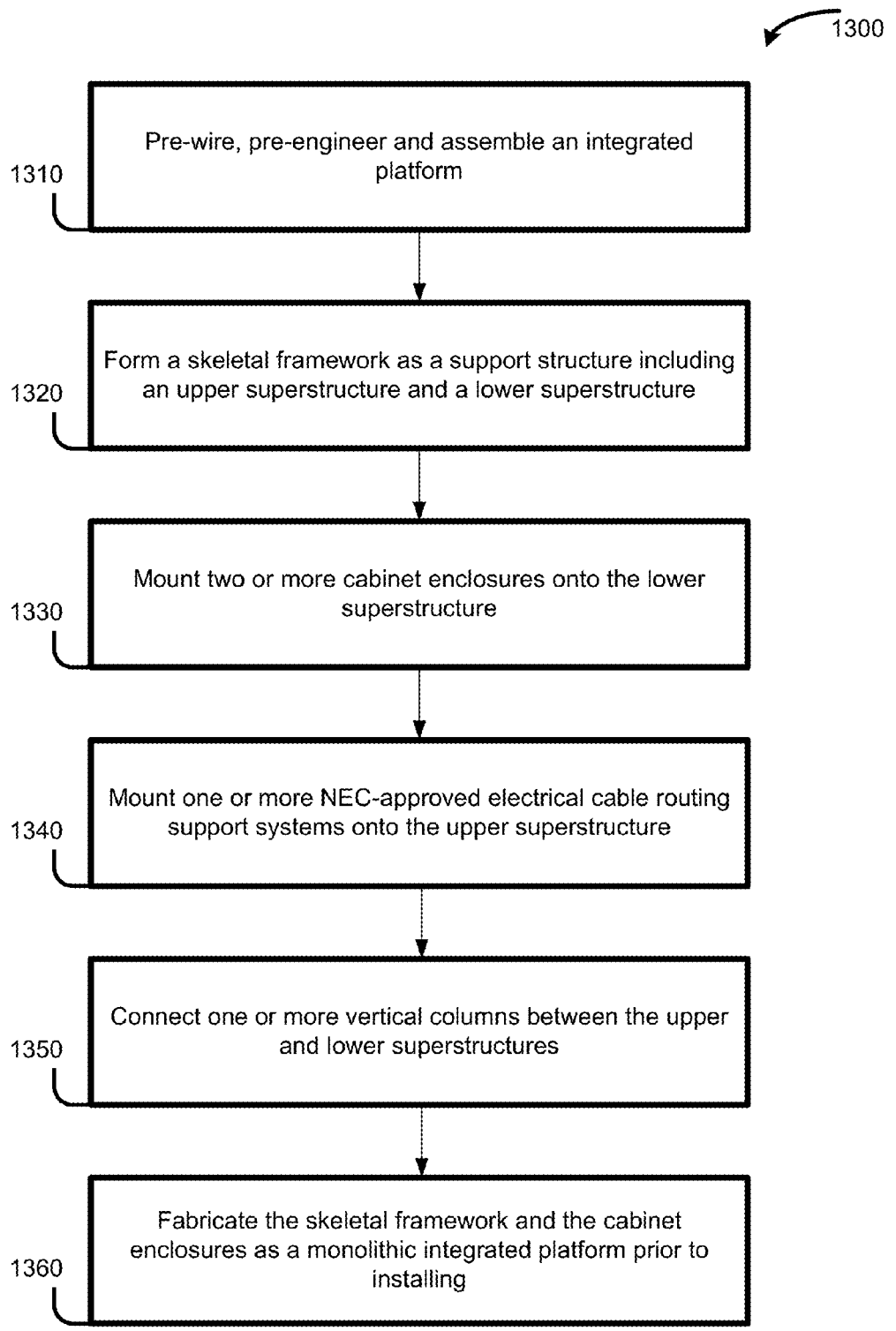
FIG. 13 illustrates a flow graph of an example method of fabricating a monolithic integrated platform.

FIG. 13 illustrates a method 1300 for fabricating an integrated platform 100. The integrated platform is pre-wired, pre-engineered, and assembled prior to being installed as a power supply and electrical distribution system (1310).

A skeletal framework 300 is formed as a support structure of the integrated platform 100 (1320). The skeletal framework 300 includes an upper superstructure 104 and a lower superstructure 106. A sample skeletal framework 300 is shown in FIG. 3. The lower superstructure 106 can be formed by coupling two or more longitudinally oriented beams 310 with two or more latitudinal (horizontally) oriented beams 308. The upper superstructure 104 can be formed by coupling two or more longitudinally oriented beams 316 with two or more latitudinal (horizontally) oriented beams 314. The upper and lower superstructures 104 and 106 are coupled to each other through vertical columns 112. Holes can be punched through or drilled into the beams 308, 310, 314, and 316 of the upper and lower superstructures at predetermined locations. Both the upper and lower superstructure can have 4 or more sides and the sides of the upper and lower superstructure may not be the same. Eye bolts 222 can be welded to skeletal framework 300 to be used by a crane to lifted the integrated platform and set into a place Two or more cabinet enclosures 108 can be mounted onto the lower superstructure 106 (1330). The mounting can be done to the holes punched or drilled through. The surface between the longitudinally oriented beams 310 and latitudinal (horizontally) oriented beams 308 of the lower superstructure can be in-filled with steel flooring or its equivalent after installation of the cabinet enclosures 108.

One or more NEC-approved electrical cable routing support systems 110 are mounted onto the upper superstructure 104 (1340). Cabling structures and cable trays 240 of the electrical cable routing support systems 110 can be mounted to the holes of the longitudinally oriented beams 316 and the horizontally oriented beams 314 of the upper superstructure to support the weight of the cabling.

One or more vertical columns 112 connect the lower and upper superstructure 106 and 104. (1350) The vertical columns 112 can be welded to the upper superstructure 104 but bolted to the lower superstructure 106 through the punched or drilled holes. Because the cabinet enclosures 108 and vertical columns 112 can both be mounted on holed punched or drilled through the lower superstructure 106, the vertical columns 112 can be bolted at locations that do not prevent access to the front or rear doors 220 of the cabinet enclosures 108.

The skeletal framework 300 and the cabinet enclosures 108 are fabricated as a monolithic integrated platform prior to being installed (1360). The integrated platform 100 with an overhead wiring is used for a non-raised floor and is assembled before being moved to the installation location.

The datacenter industry is beginning to realize the benefits of the early industrial revolution. Standardized modular power center designs provide some of the same benefits to design and construction personnel. Instead of hand-building custom electrical systems for each datacenter, the modular approach allows for greater deployment speed, improved quality and lower costs, all achieved by using factory-based labor. The use of modules also relieves labor stacking on the job site, while reducing the overall cost of the work by a significant amount. Cost savings can be attained using factory labor. Modularizing datacenter components permits control over cost, quality, and schedule.

In one embodiment, the software used to facilitate the algorithms discussed herein can be embodied onto a non-transitory machine-readable medium. A machine-readable medium includes any mechanism that stores information in a form readable by a machine (e.g., a computer). For example, a machine-readable medium includes read only memory (ROM); random access memory (RAM); magnetic disk storage media; optical storage media; flash memory devices; Digital VideoDisc (DVD's), EPROMs, EEPROMs, FLASH memory, magnetic or optical cards, or any type of media suitable for storing electronic instructions.

It should be borne in mind, however, that all of these and similar terms are to be associated with the appropriate physical quantities and are merely convenient labels applied to these quantities. Unless specifically stated otherwise as apparent from the above discussions, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers, or other such information storage, transmission or display devices.

While some specific embodiments of the design have been shown the design is not to be limited to these embodiments. For example, most functions performed by electronic hardware components may be duplicated by software emulation. Thus, a software program written to accomplish those same functions may emulate the functionality of the hardware components in input-output circuitry. The design is to be understood as not limited by the specific embodiments described herein, but only by scope of the appended claims.

What is claimed is:

1. A monolithic, pre-wired, pre-engineered, and pre-assembled integrated platform for a critical power supply and electrical distribution system that is scalable and modular, comprising:
    a skeletal framework that acts as a cable routing and an equipment support structure, the skeletal framework including an upper superstructure and a lower superstructure;
    two or more cabinet enclosures mounted onto the lower superstructure,
        where the two or more cabinet enclosures include one or more switchboard cabinet enclosures that have at least a set of circuit breakers and one or more bus bars to direct electricity from one or more sources of electrical power supply to other electrical loads including transformers, panelboards, control equipment, and, ultimately, to individual electrical system loads,
        wherein a weight of the two or more cabinet enclosures is supported by the skeletal framework;
    one or more National Electric Code (NEC) approved electrical cable routing support systems mounted onto the upper superstructure; and
    one or more vertical columns connected between the upper superstructure and the lower superstructure,
        wherein the skeletal framework and the cabinet enclosures are fabricated in place prior to the integrated platform being installed into a building site as the monolithic, pre-wired, pre-engineered, and pre-assembled integrated platform, which is configured to allow the integrated platform including its mounted cabinet enclosures to be installed into the building site as the monolithic, pre-wired, and pre-assembled integrated platform.

2. The integrated platform of claim 1, wherein a horizontal surface of the lower superstructure has a clearance of no greater than 7.5 inches above a ground to make the integrated platform suitable for a non-raised floor installation in a datacenter.

3. The integrated platform of claim 1,
    wherein each and every power cable and control cable going external to the integrated platform is routed through the one or more NEC-approved electrical cable routing support systems,
    wherein the one or more NEC-approved electrical cable routing support systems mounted onto the upper superstructure are located above the two or more cabinet enclosures, and
    wherein each NEC-approved electrical cable routing support system includes one or more cable trays.

4. The integrated platform of claim 1,
    wherein the two or more cabinet enclosures also include a first cabinet enclosure and a second cabinet enclosure,
    wherein at least
        a main power supply input breaker is housed in the first cabinet enclosure and
        a power distribution output panel to supply power to the electrical loads is housed in the second cabinet enclosure, and
    wherein each cabinet enclosure is mounted to two or more longitudinal beams and two or more latitudinal beams of the lower superstructure through holes punched or drilled through the longitudinal and latitudinal beams.

5. The integrated platform of claim 1, further comprising:
    three or more vertical columns configured to connect the upper superstructure and the lower superstructure on at least two sides of the upper and lower superstructures,
        wherein a total number of vertical columns connecting between the upper superstructure and the lower superstructure is dependent upon at least three factors including
            i) an overall weight of the integrated platform including the weight of the two or more cabinet enclosures and a weight of cables and cable trays of the upper superstructure,
            ii) a minimum spacing between the cabinet enclosures based on national electric codes, and
            iii) locations where the vertical columns can be placed to allow rear door opening and entry into cabinet enclosures neighboring the vertical columns.

6. The integrated platform of claim 1,
wherein each vertical column connected between the upper superstructure and the lower superstructure is
   1) welded at an upper end of the vertical column to the upper superstructure, and
   2) bolted at a lower end of the vertical column to the lower superstructure, in order to allow an installation of the cabinet enclosures onto the lower superstructure without a presence of the one or more vertical columns.

7. The integrated platform of claim 1, further comprising:
the upper superstructure is formed by longitudinally orientated beams coupled with horizontally orientated beams,
where two or more longitudinally orientated beams in parallel to each other are coupled with two or more horizontally orientated beams in parallel to each other,
wherein the longitudinally orientated and horizontally orientated beams have holes punched or drilled into them for securely attaching cabling structures and cable trays to the longitudinally orientated and horizontally orientated beams,
where the holes are punched according to one of
   1) specific locations or
   2) a set pattern of locations, and
wherein one or more lighting fixtures are mounted under the upper superstructure.

8. The integrated platform of claim 1, further comprising:
cabling between the cabinet enclosures mounted on the lower superstructure is electrically terminated and connected and is routed
1) through internal connections wired in a controlled sequence between neighboring cabinet enclosures, and
2) along the one or more vertical columns to the upper superstructure and within the upper superstructure or just below the upper superstructure,
wherein the cabling substantially avoids cross wires over each other or over the cabinet enclosures in the lower superstructure.

9. The integrated platform of claim 8,
wherein control and power cables going external to the integrated platform are routed along the one or more vertical columns to the upper superstructure and are bundled in one or more cable trays being supported by the upper superstructure, and
wherein the one or more cable trays are configured to support a weight of the control and power cables.

10. The integrated platform of claim 1, further comprising:
at least a pair of electrical ground bars to ground the integrated platform,
   wherein the pair of electrical ground bars are configured to be coupled to a ground external to the integrated platform, and
   wherein the the pair of electrical ground bars includes a master ground bar and a secondary ground bar;
one or more voltage distribution panels mounted onto the skeletal framework,
   where the one or more voltage distribution panels are configured to supply a nominal low-voltage electrical connection of 125 V;
one or more junction box receptacles mounted onto the skeletal framework; and
one or more AC power column receptacles mounted onto the one or more vertical columns to supply AC plug-ins,
   wherein a wiring through a conduit or other NEC-approved electrical cable routing system connects a first voltage distribution panel to the one or more AC power column receptacles.

11. The integrated platform of claim 1,
wherein a first shape of the upper superstructure mirrors and is proportional to a second shape of the lower superstructure directly below the upper superstructure, and
wherein the first shape and the second shape allow easy connection points for the one or more vertical columns to connect the upper superstructure and the lower superstructure.

12. The integrated platform of claim 1,
wherein a height of the integrated platform from a bottom of the lower superstructure to a top of the upper superstructure including cable trays is less than 12 feet in height, and a length and a width of the integrated platform occupy a floor space footprint of less than 480 square feet,
wherein the integrated platform is configured to provide up to 1200 KW in critical power from main and backup switchgear cabinet enclosures, and
wherein a shipping package of the integrated platform is configured to have a footprint size not to exceed 50 feet by 12 feet and a weight not to exceed 100,000 pounds.

13. The integrated platform of claim 4,
wherein the holes punched or drilled through the longitudinally orientated and horizontally orientated beams have one of
   1) specific locations or
   2) a predefined pattern of locations for the cabinet enclosures to mount to the holes,
wherein the lower superstructure is in-filled after mounting of the cabinet enclosures, and
where in-filling includes steel flooring.

14. The integrated platform of claim 1,
wherein a weight of the integrated platform including the cabinet enclosures is configured to
   1) be heavy enough to be rated secure in an earthquake without being tied to a foundation of a building, and
   2) have at least a 1.5 importance factor rating, and
wherein connection points of the skeletal framework including the upper superstructure, the lower superstructure, and the one or more vertical columns are welded together or connected via bolts and torqued to comply with Zone 4 seismic requirements.

15. The integrated platform of claim 1,
wherein one of
   1) the lower superstructure or
   2) both the lower and upper superstructures have a series of eye bolts welded into skeletal frame beams, and
wherein the integrated platform is configured to be lifted and set into a place by a crane using the eye bolts.

16. The integrated platform of claim 1,
wherein each of the cabinet enclosures has an access door from one of
   1) a front or
   2) a combination of the front and a back of the cabinet enclosure,
wherein faces of the cabinet enclosures are lined and spaced according to national electric codes,
wherein the skeletal frame is configured to be clear on all sides and provide access from both the front and back of the cabinet enclosures, and wherein the one or more vertical columns connecting the upper and lower superstructures are placed such that each cabinet enclosure is configured to provide a rear door access clear of any vertical columns neighboring to the cabinet enclosure.

17. The integrated platform of claim 1,
wherein the lower superstructure includes cabinet enclosures mounted to the skeletal framework, the cabinet enclosures including one or more selected from
1) switchboards,
2) power distribution output panels,
3) control circuits,
4) transformers,
5) uninterruptible power supplies, and
6) programmable logic controllers configured to control how the sequence of breakers open and close during fault conditions,
wherein the cabinet enclosures are closely mounted side-by-side onto the skeletal framework according to an NEC-approved code, and
wherein interconnections between cabinet enclosures that need over current protection are routed through the upper superstructure rather than through internal connections wired between neighboring cabinet enclosures.

18. A method of fabricating a monolithic integrated platform, comprising:
pre-wiring, pre-engineering and assembling the integrated platform as a power supply and electrical distribution system;
forming a skeletal framework as a support structure of the integrated platform, the skeletal framework including an upper superstructure and a lower superstructure;
mounting two or more cabinet enclosures onto the lower superstructure,
where the two or more cabinet enclosures include one or more switchboard cabinet enclosures that have at least a set of circuit breakers and one or more bus bars to direct electricity from one or more sources of electrical power supply to other electrical loads including transformers, panelboards, control equipment, and, ultimately, to individual electrical system loads, and
wherein a weight of the two or more cabinet enclosures is supported by the skeletal framework;
mounting one or more NEC-approved electrical cable routing support systems onto the upper superstructure;
connecting one or more vertical columns between the upper superstructure and the lower superstructure; and
fabricating the skeletal framework and the cabinet enclosures as a monolithic, pre-wired, and pre-assembled integrated platform in place prior to installing the integrated platform into a building site, which allows the integrated platform including its mounted cabinet enclosures to be installed into the building site as the monolithic, pre-wired, and pre-assembled integrated platform.

19. The method of claim 18, further including
routing power and control cables going external to the integrated platform through the one or more NEC-approved electrical cable routing support systems coupled to the upper superstructure;
routing wires between the cabinet enclosures
1) through internal connections wired between neighboring cabinet enclosures, and
2) along the one or more vertical columns to the upper superstructure and within the upper superstructure or just below the upper superstructure; and
grounding one or more ground bars of the integrated platform to a ground external to the integrated platform.

20. The method of claim 18, further including
forming the lower superstructure by coupling a first group of two or more longitudinally orientated beams and a second group of two or more horizontally oriented beams;
forming the upper superstructure by coupling a third group of two or more longitudinally orientated beams and a fourth group of two or more horizontally oriented beams;
drilling holes into the lower and upper superstructure beams in predetermined locations;
mounting the cabinet enclosures to holes in the first group of two or more longitudinally oriented beams and the second group of two or more horizontally oriented beams;
in-filling the cabinet enclosures after being mounted to the lower superstructure;
housing one or more selected from
1) switchboards,
2) power distribution output panels,
3) control circuits,
4) transformers,
5) uninterruptible power supplies, and
6) programmable logic controllers in the cabinet enclosures mounted to the lower superstructure;
attaching cabling support structures and cable trays to holes in the third group of two or more longitudinally oriented beams and the fourth group of two or more horizontally oriented beams; and
welding eye bolts to the skeletal framework;
providing one or more selected from
1) rear access door and
2) front access door to the cabinet enclosures.

* * * * *